(12) United States Patent
Dewey et al.

(10) Patent No.: US 11,935,891 B2
(45) Date of Patent: *Mar. 19, 2024

(54) NON-SILICON N-TYPE AND P-TYPE STACKED TRANSISTORS FOR INTEGRATED CIRCUIT DEVICES

(71) Applicant: Intel Corporation, Santa Clara, CA (US)

(72) Inventors: Gilbert Dewey, Beaverton, OR (US); Patrick Morrow, Portland, OR (US); Ravi Pillarisetty, Portland, OR (US); Rishabh Mehandru, Portland, OR (US); Cheng-ying Huang, Hillsboro, OR (US); Willy Rachmady, Beaverton, OR (US); Aaron Lilak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/839,338

(22) Filed: Jun. 13, 2022

(65) Prior Publication Data

US 2022/0310605 A1    Sep. 29, 2022

Related U.S. Application Data

(63) Continuation of application No. 16/957,664, filed as application No. PCT/US2018/020612 on Mar. 2, 2018, now Pat. No. 11,387,238.

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823807* (2013.01); *H01L 25/074* (2013.01);
(Continued)

(58) Field of Classification Search
CPC ......... H01L 27/0924; H01L 21/823807; H01L 25/074; H01L 27/0688; H01L 29/0669;
(Continued)

(56) References Cited

U.S. PATENT DOCUMENTS 11,387,238 B2 *   7/2022  Dewey ................ H01L 29/7782
2010/0327261 A1  12/2010  Hudait et al.
(Continued)

FOREIGN PATENT DOCUMENTS

WO    2016209278    12/2016
WO    2017111848     6/2017

OTHER PUBLICATIONS

International Preliminary Report on Patentability from PCT/US2018/020612 dated Sep. 17, 2020, 7 pgs.
(Continued)

*Primary Examiner* — Tong-Ho Kim
(74) *Attorney, Agent, or Firm* — Essential Patents Group, LLP

(57) ABSTRACT

Multiple non-silicon semiconductor material layers may be stacked within a fin structure. The multiple non-silicon semiconductor material layers may include one or more layers that are suitable for P-type transistors. The multiple non-silicon semiconductor material layers may further include one or more one or more layers that are suited for N-type transistors. The multiple non-silicon semiconductor material layers may further include one or more intervening layers separating the N-type from the P-type layers. The intervening layers may be at least partially sacrificial, for example to allow one or more of a gate, source, or drain to
(Continued)

wrap completely around a channel region of one or more of the N-type and P-type transistors.

20 Claims, 10 Drawing Sheets

(51) Int. Cl.
    *H01L 25/07*     (2006.01)
    *H01L 27/06*     (2006.01)
    *H01L 29/06*     (2006.01)
    *H01L 29/778*     (2006.01)
    *H01L 29/78*     (2006.01)

(52) U.S. Cl.
    CPC ...... *H01L 27/0688* (2013.01); *H01L 29/0669* (2013.01); *H01L 29/7782* (2013.01); *H01L 29/785* (2013.01)

(58) Field of Classification Search
    CPC ............... H01L 29/7782; H01L 29/785; H01L 29/0653; H01L 29/0847; H01L 29/66469; H01L 21/8221; H01L 21/84; H01L 21/845; H01L 29/0673; H01L 29/42392; H01L 29/66439; H01L 29/66742; H01L 29/775; H01L 29/78618; H01L 29/78681; H01L 29/78684; H01L 29/78696; H01L 21/8258; B82Y 10/00
    USPC ........................................................ 257/194
    See application file for complete search history.

(56) References Cited

U.S. PATENT DOCUMENTS

| 2015/0325481 A1* | 11/2015 | Radosavljevic .. H01L 29/66439 438/154 |
|---|---|---|
| 2016/0126109 A1 | 5/2016 | Sun et al. |
| 2019/0131396 A1 | 5/2019 | Zhang et al. |

OTHER PUBLICATIONS

International Search Report & Written Opinion dated Dec. 3, 2018, for PCT Patent Application No. PCT/US2018/020612.
Non-Final Office Action from U.S. Appl. No. 16/957,664 dated Nov. 8, 2021, 14 pgs.
Notice of Allowance from U.S. Appl. No. 16/957,664 dated Mar. 4, 2022, 8 pgs.

* cited by examiner

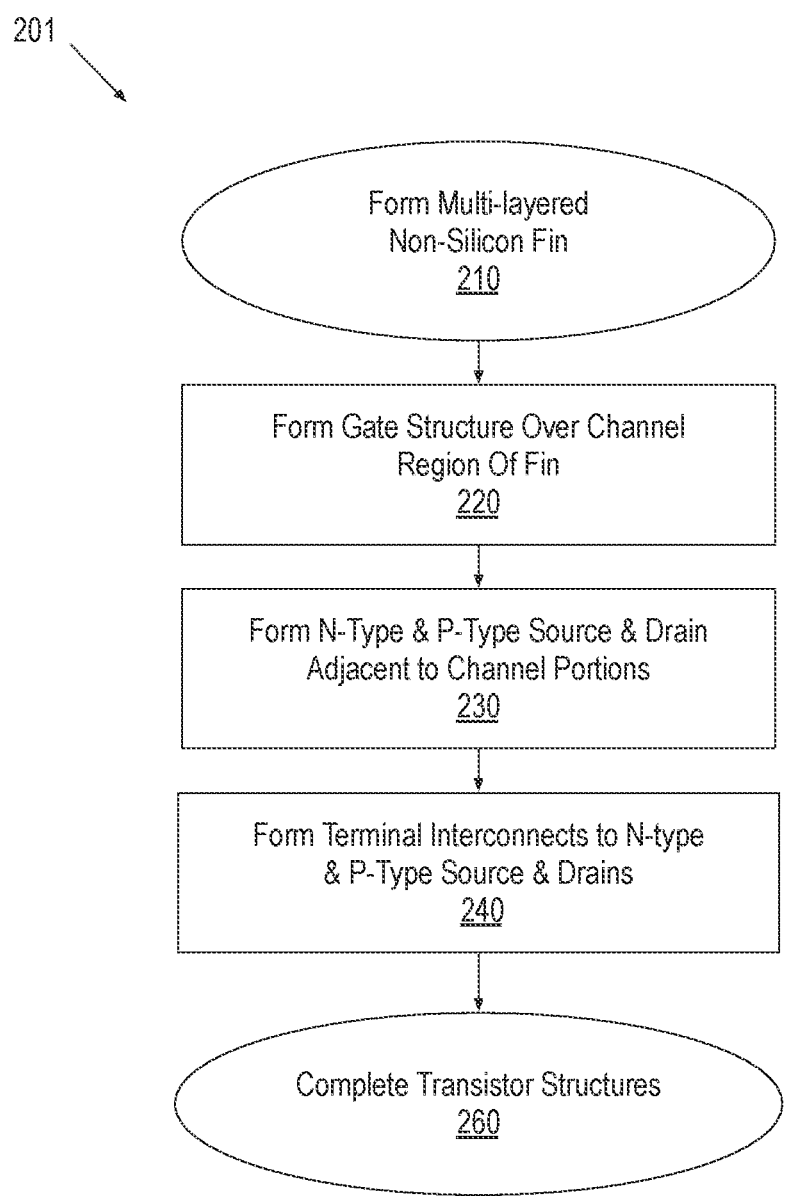

NON-SILICON N-TYPE AND P-TYPE STACKED TRANSISTORS FOR INTEGRATED CIRCUIT DEVICES

CLAIM OF PRIORITY

This application is a continuation of, and claims the benefit of priority to, U.S. patent application Ser. No. 16/957,664, filed on Jun. 24, 2020 and titled "NON-SILICON N-TYPE AND P-TYPE STACKED TRANSISTORS FOR INTEGRATED CIRCUIT DEVICES," which is a National Stage Entry of, and claims the benefit of priority to, PCT Application No. PCT/US2018/020612, filed on Mar. 2, 2018 and titled "NON-SILICON N-TYPE AND P-TYPE STACKED TRANSISTORS FOR INTEGRATED CIRCUIT DEVICES," which is incorporated by reference in entirety.

BACKGROUND

Device density in integrated circuits (ICs) has increased for decades in conformance with Moore's law. However, as the dimensions of a device structure shrink with each technology generation, it becomes increasingly difficult to further reduce structural dimensions. Next-generation transistor architectures may employ gate-all-around (GAA) architectures (also known as nanowire/nanoribbon transistors) to enable a further reduction in channel length (e.g., for the Complementary Metal Oxide Semiconductor (CMOS) 10 nm technology node, and beyond).

Three-dimensional (3D) scaling is now of considerable interest as reductions in z-height (device thickness) offer another avenue of increasing overall device density and IC performance 3D device fabrication techniques suitable for novel non-silicon materials are all the more advantageous as higher channel mobility materials may offer synergy between higher device density and superior transistor performance.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2 illustrates a flow diagram illustrating methods for fabricating stacked non-silicon N-Type and P-Type nanowire transistor structures, in accordance with some embodiments;

DETAILED DESCRIPTION

Figure 1A:
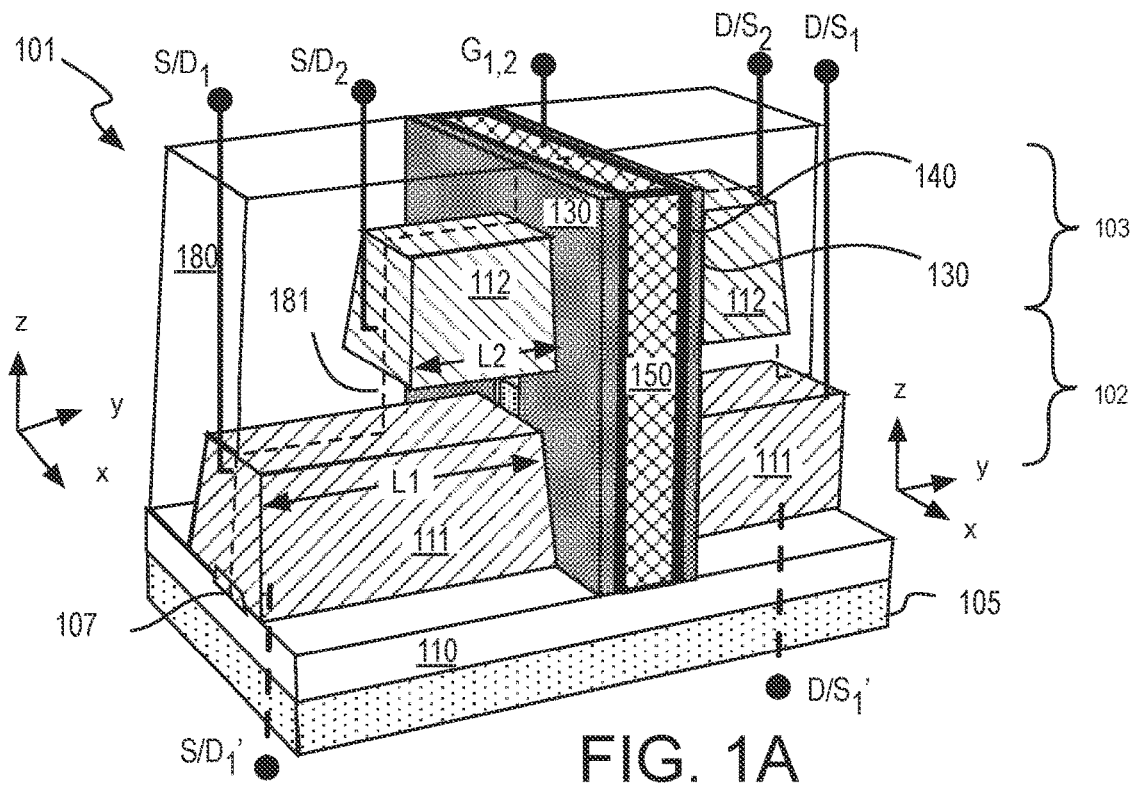
FIG. 1A illustrates an isometric view of a stacked non-silicon N-Type and P-Type nanowire transistor structure, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other, without any intermediary materials or devices. "Coupled" may be used to indicated that two or more elements are in either direct or indirect (with other intervening elements between them) physical or electrical contact with each other, and/or that the two or more elements co-operate or interact with each other (e.g., as in a cause an effect relationship), through one or more passive or active intermediary materials or devices.

A "device" may generally refer to an apparatus according to the context of the usage of that term. For example, a device may refer to a stack of layers or structures, a single structure or layer, a connection of various structures having active and/or passive elements, etc. Generally a device is a three dimensional structure with a lateral x-y plane and a height along the z direction within an x-y-z Cartesian coordinate system. The plane of the device may also be the plane of an apparatus, which comprises the device.

The terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "adjacent" generally refers to a position of a thing being laterally (within an x-y plane) next to (e.g., immediately next to), or adjoining another thing (e.g., abutting it).

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Unless otherwise specified the use of the ordinal adjectives "first," "second," and "third," etc., to describe a common object, merely indicates that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of their use, the terms "substantially equal," "about equal" and "approximately equal" mean that there is no more than incidental variation between among things so described. In the art, such variation is typically no more than +/−10% of a predetermined target value.

As described further below, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

In some embodiments, lattice mismatch within the stack of N-type and P-type transistors is controlled through use of Ge, and III-V alloy materials having a close lattice match with Ge. For example, in some embodiments a stack of P-type and N-type transistors includes Ge, and InGaAs channel semiconductor. As described further below, Ge may be included in base layer of a stack of non-silicon semiconductor material layers. This Ge base layer may facilitate heteroepitaxy from a silicon substrate and/or facilitate epitaxial stack growth following a layer transfer. This Ge base layer may be employed within a channel region of a P-type transistor, or employed only as a sub-fin epitaxial seed layer. A III-V alloy material having high electron mobility, such as InGaAs, may be included in an upper layer of a stack of non-silicon semiconductor material layers. This III-V alloy layer may be employed within a channel region of an N-type transistor. One or more intervening III-V alloy layers between the P-type and N-type transistor layers may facilitate heteroepitaxy of the semiconductor material layers and may further facilitate electrical isolation and/or fabrication of stacked nanowire FETs.

FIG. 1A is an isometric view of external surfaces of a stacked non-silicon (e.g., high-mobility) CMOS device structure including both a transistor structure 102 and a transistor structure 103, in accordance with some embodiments. As shown, stacked non-silicon CMOS device structure 101 is over a crystalline region 105. An isolation dielectric material 110 separates crystalline region 105 from device structure 101. Transistor structure 102 includes a source and drain 111. In some exemplary embodiments, source and drain 111 includes semiconductor material that has a first conductivity type, such as P-type or N-type. Transistor structure 103 further includes source and drain 112, which are vertically (e.g., in z-dimension) separated from source and drain 111. In some exemplary embodiments, source and drain 112 include semiconductor that has a second conductivity type, complementary to the conductivity type of source and drain 111. For example, in embodiments where source and drain 111 include P-type semiconductor, source and drain 112 include N-type semiconductor. Alternatively, in embodiments where source and drain 111 include N-type semiconductor, source and drain 112 include P-type semiconductor. Hence, device structure 101 is referred to herein as a stacked CMOS device structure.

Source and drain 111 may include monocrystalline or polycrystalline semiconductor. In some embodiments, source and drain 111 include a Group IV or III-V semiconductor doped with any impurity dopants known to be suitable for the desired conductivity type, and to any concentration known to be suitable for transistors. Source and drain 112 may likewise include a monocrystalline or polycrystalline semiconductor. In some embodiments, source and drain 112 include a Group IV or III-V semiconductor doped with any impurity dopants known to be suitable for the desired conductivity type, and to any concentration known to be suitable for transistors. In an embodiment where source and drain 111 is P-Type, source and drain 111 is a high mobility Group IV semiconductor (e.g., Ge) including any suitable concentration of acceptor impurities. In an embodiment where source and drain 112 is N-type, source and drain 112 is a high mobility Group III-V semiconductor alloy including any suitable concentration of donor impurities. The group III-V alloy may be any binary, ternary, or quaternary III-V alloy known to be suitable as source and drain material. In one specific example, source and drain 112 includes at least In and As (e.g., binary InAs). Source and drain 111 may be "raised" (e.g. epitaxial growths), having larger lateral width (e.g., x-dimensions) and/or height (e.g., z-dimensions) than that of channel material layers under gate electrode 150. Source and drain 112 may also be raised, having larger lateral width (e.g., x-dimensions) and/or height (e.g., z-dimensions) than channel material layers under gate electrode 150. In the exemplary embodiment shown in FIG. 1A, both source and drain 111 and source and drain 112 are raised. Alternatively, source and drain 111 and/or source and drain 112 may be impurity doped ends of semiconductor material layers that have been patterned into a stacked structure and separated through removal of an intervening sacrificial material layer.

A dielectric material 180 is over source and drain 111, as well as, source and drain 112. Dielectric material 180 separates source and drain 111 from source and drain 112 in the illustrated example. Dielectric material 180 may have any composition of suitable dielectric strength for the purpose of electrically isolating laterally adjacent devices and/or vertically adjacent devices. Dielectric material 180 may be any material known to be suitable as an interlayer dielectric (ILD), for example. In some embodiments, dielectric material 180 is a compound of silicon and/or a compound of oxygen, and/or a compound of nitrogen. Examples include silicon dioxide, silicon nitride, silicon oxynitride, and low-k materials (e.g., having a relative permittivity below 3.3).

A first channel material or region, below gate electrode 150, couples together source and drains 111. As used herein, a "channel material" is a semiconductor material layer within which a channel is to be developed during operation of a transistor. Hence, a "channel material" is in reference to a physical structure that is present regardless of whether a channel is present within that layer (e.g., during an operative transistor state), or not (e.g., during an inoperative transistor state). Gate electrode 150 is further separated from source and drains 111 by an external dielectric spacer 130. Another channel material or region, also below gate electrode 150, further couples together source and drains 112. In exemplary embodiments, at least one of these channel regions comprises other than silicon. In some advantageous embodiments, both of these channel regions comprise other than silicon. The channel regions may have any non-silicon semiconductor composition known to have higher mobility than silicon, as further described below. Gate electrode 150 is further separated from source and drains 111 by an external dielectric spacer 130. Dielectric spacer 130 likewise separates gate electrode 130 from source and drains 112. In the illustrated example, a gate dielectric 140 is also visible in FIG. 1A. The gate electrode 150 and gate dielectric 140 may therefore be operable with the channel semiconductor materials as two metal-oxide-semiconductor (MOS) transistors of complementary conductivity type.

CMOS structure 101 may be operable such that transistor structure 102 is in an "ON" state under a first gate bias that also places transistor structure 103 in an "OFF" state. CMOS structure 101 may be further operable such that transistor structure 102 is in an "OFF" state under a second gate bias that also places transistor structure 103 in an "ON" state. In some specific examples, CMOS structure 101 is operable as a vertically stacked CMOS inverter where for a first (e.g., low) input level, the PMOS (e.g., transistor structure 102) is "ON" and the NMOS (e.g., transistor structure 102) is "OFF." In this condition, an output voltage of transistor structure 102 is substantially the same as the source input voltage with the PMOS operable as a "pull-up" transistor. Similarly, a second (e.g., high) input level, the NMOS (e.g., transistor structure 103) is "ON" and the PMOS (e.g., transistor structure 103) is "OFF." In this condition, an output voltage of transistor structure 103 may be substantially at a ground potential with the NMOS operable as a "pull-down" transistor.

Device structure 101 includes two or more source or drain terminal contacts. In some embodiments, the source or drain terminal contacts maintain electrical isolation between all four source and drain terminals 111, 112 such that all four source and drain terminals 111, 112 may be coupled to independent nodes of an integrated circuit. For example, in FIG. 1A, a first source or drain terminal contact $S/D_1$ is in contact with a first source and drain 111 while a second source or drain terminal contact $S/D_2$ is in contact with a first source and drain 112. A first drain or source terminal contact $D/S_1$ is in contact with another source and drain 111 while a second drain or source terminal contact $D/S_2$ is in contact with another source and drain 112. Although illustrated in schematic form for the sake of clarity, terminal contacts $S/D_1$, $S/D_2$, $D/S_1$, $D/S_2$, may each have any structure suitable for a source or drain terminal contact. For example, terminal contacts $S/D_1$, $S/D_2$, $D/S_1$, $D/S_2$ may each include one or more contact metals and/or conductive via structures that extend through dielectric material 180 from an overlying metallization level (not depicted) substantially along the route schematically shown in FIG. 1A.

In some embodiments where all terminal contacts $S/D_1$, $S/D_2$, $D/S_1$, $D/S_2$ have a "top-down" architecture, source and drain 111 have lateral length L1 (e.g., as measured from a centerline of gate electrode 150) that exceeds lateral length L2 of source and drain 112. Lateral length L1 may be greater than lateral length L2 by an amount sufficient to maintain electrical isolation (e.g., lateral separation) between terminal contacts $S/D_1$, $S/D_2$ and/or between terminal contacts $D/S_1$, $D/S_2$.

In some alternative embodiments, two or more of terminal contacts $S/D_1$, $S/D_2$, $D/S_1$, $D/S_2$ may have a "bottom-up" architecture. For example, in FIG. 1A, terminal contacts $S/D_1'$ and $D/S_1'$ are further illustrated with dashed lines demarking a route through isolation dielectric material 110. For such embodiments, source and drain 111 may have a lateral length L1 that exceeds lateral length L2 of source and drain 112, or lateral length L1 may be substantially the same as lateral length L2.

In some embodiments, the source or drain terminal contacts electrically couple together two or more of source and drain terminals 111, 112. For example, in FIG. 1A, source or drain terminal contact S/D$_2$ may be in contact both a first of source and drain 111 and a first of source and drain 112. For such embodiments, terminal contacts S/D$_1$ and S/D$_2$ may comprise a single block contact metal and/or conductive via structure. Hence terminal contact S/D$_2$ may electrically interconnect either a source or drain 111 with either of a source or drain 112. As another example, source or drain terminal contact D/S$_2$ may be in contact both a second of source and drain 111 and a second of source and drain 112. For such embodiments, terminal contacts D/S$_1$ and D/S$_2$ may comprise a single block contact metal and/or conductive via structure. Hence terminal contact S/D$_2$ may also electrically interconnect either a source or drain 111 with either of a source or drain 112. In further embodiments, only one of source and drain 111 is coupled to only one of source or drain 112. As one specific example, sources of transistors 102 and 103 may be tied together by terminal contacts S/D$_1$ and/or S/D$_2$ while drains of transistors 102 and 103 are independently interconnected through D/S$_1$ and D/S$_2$. In another specific example, drains of transistors 102 and 103 may be tied together by terminal contacts D/S$_1$ and/or D/S$_2$ while sources of transistors 102 and 103 are independently interconnected through S/D$_1$ and S/D$_2$.

Figure 1B:
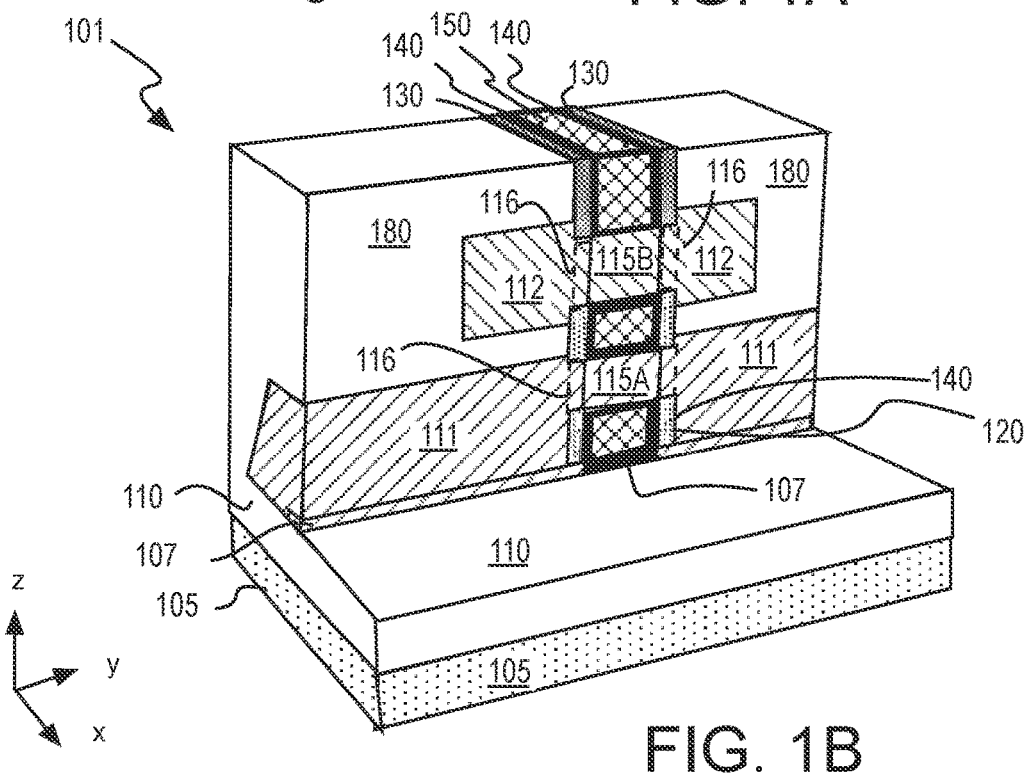
FIG. 1B illustrates an isometric sectional view of the stacked non-silicon N-Type and P-Type nanowire transistor structure illustrated in FIG. 1A, in accordance with some embodiments.

FIG. 1B is an isometric sectional view further illustrating internal portions and interfaces of CMOS device structure 101 as viewed along the plane 181 denoted in FIG. 1A. In FIG. 1B, a channel material 115A including a first non-silicon semiconductor material extends a lateral length between a source and drain 111 while a channel material 115B including a second non-silicon semiconductor material extends a lateral length between a source and drain 112. In the illustrative embodiment, semiconductor channel materials 115A and 115B are aligned in a vertical stack (e.g., in the z-dimension). Within the lateral length of each semiconductor channel material 115A, 115B there is a channel region disposed between two end portions 116 denoted in dashed line. End portions 116 couple channel regions of channel materials 115A-115B to source and drains 111, 112, respectively. End portions 116 may include the same semiconductor material as the channel region, or may include the same semiconductor material as the source and drain. Gate electrode 150 is separated from channel materials 115A and 115B by gate dielectric 140. Within at least the channel region the gate stack including gate electrode 150 and gate dielectric 140 is between channel material 115A and isolation dielectric 110 and/or crystalline region 105. Within at least the channel region the gate stack is also between channel material 115A and channel material 115B. An embedded spacer 120 is between end portions 116 and isolation dielectric 110 and/or crystalline region 105. Embedded spacer 120 may have any dielectric composition suitable as a gate spacer for transistor applications, such as, but not limited to, materials comprising both silicon and oxygen (e.g., SiO, SiOC, SiON) and/or both silicon and nitrogen (e.g., SiN, SiON). In some exemplary embodiments, embedded spacer 120 provides a separation of no more than 5 nm (e.g., 1-5 nm).

Notably, CMOS structure 101 is illustrated as including only one semiconductor channel material coupled to each source and drain. However, the illustrated structure is merely an example and one or more of the channel materials 115A and 115B may be replicated, for example to increase the current carrying capability of one or more of a PMOS or NMOS transistor. For example, a multi-layered fin may increasing to include additional channel materials, such as two channel materials 115A and two channel materials 115B, or three channel materials 115A and three channel materials 115B, or four channel materials 115A and four channel materials 115B, etc. For such embodiments, additional channel materials 115A may be coupled in parallel to source and drain 111 to increase the current carrying capability of the transistor. Likewise, additional channel materials 115B may be coupled in parallel to source and drain 112. Hence, CMOS structure 101 may have substantially the same external structure illustrated in FIG. 1A with the internal structure illustrated in FIG. 1B deviating to include additional channel materials.

For some exemplary embodiments, substrate crystalline region 105 comprises silicon (Si), which may be advantageous for integration of structure 101 on large format substrate (e.g., 300-450 mm diameters). Crystallographic orientation of a substantially monocrystalline substrate in exemplary embodiments is advantageously (100), but may also be (111), or (110). Other crystallographic orientations are also possible. For example, a substrate working surface may be miscut, or offcut 2-10° toward [110]. Other substrate embodiments are also possible, with some examples including silicon-carbide (SiC), sapphire, a III-V compound semiconductor (e.g., GaAs), germanium (Ge), or silicon-germanium (SiGe). In the illustrated embodiment, isolation dielectric 110 separates crystalline region 105 from an overlying device layer 107. For such embodiments, device layer 107, isolation dielectric 110 and crystalline region 105 may be layers of semiconductor on insulator (SOI) substrate. While device layer 107 may be silicon (e.g., monocrystalline silicon), in some advantageous embodiments device layer 107 comprises Ge (e.g., monocrystalline Ge). Monocrystalline Ge has a better lattice match with III-V alloys than does silicon, potentially enabling better crystal quality in the channel materials of CMOS device 101. In still other embodiments, device layer 107 is a group III-V semiconductor alloy.

Notably, CMOS structure 101 is applicable to a wide variety of semiconductor material systems including non-silicon systems (e.g., Ge-based group IV, or group III-V alloy systems). In some embodiments, one of channel materials 115A and 116B is a crystal including Ge (e.g., intrinsic Ge or SiGe alloy) while another of channel materials 115A and 116B is a crystal including a III-V alloy. The III-V alloy may be any binary, tertiary, or quaternary alloy suitable for a transistor channel In some embodiments, one of semiconductor channel materials 115A and 116B is a Ge crystal (e.g., intrinsic Ge) while another of semiconductor channel materials 115A and 115B is a III-V crystal (e.g., GaAs, InP, InAs, InGaAs, AlGaAs, GaP, AlAs, InGaP, InSb, GaAsSb). In one such embodiment, where transistor structure 102 is a P-Type transistor and transistor structure 103 is an N-Type transistor, channel material 115A is a Ge crystal (e.g., monocrystalline), and channel material 115B is an InGaAs crystal (e.g., monocrystalline). For these exemplary embodiments, the Ge crystal has the advantage of high hole mobility while the InGaAs crystal has the advantage of high electron mobility. Lattice mismatch between the InGaAs and Ge can be minimal as GaAs has substantially the same lattice constant as Ge. Indium can be introduced into channel materials 115B to some threshold concentration that maintains a desired match between crystalline layers. For some In$_x$Ga$_{1-x}$As embodiments, In content (x) may be as high as 0.7 (e.g., $In_{0.7}Ga_{0.3}As$) for peak carrier mobility. However, in some advantageous $In_xGa_{1-x}As$ embodiments where the InGaAs layer for an N-Type transistor is stacked upon a Ge (SiGe)-based P-Type transistor material, indium content (x) is less than 0.5, and more advantageously between 0.2 and 0.4. $In_xGa_{1-x}As$ that has a concentration of 0.2 to 0.4 has the advantage of a better lattice match to Ge. Stacking the InGaAs crystal over the Ge crystal (rather than doing the opposite arrangement) may offer the further advantages of limiting lattice mismatch to an uppermost semiconductor layer of CMOS device structure 101. Other embodiments where channel material 115A is a crystal including a Group III-V alloy. (e.g., GaAs, InP, InAs, InGaAs, AlGaAs, GaP, AlAs, InGaP, InSb, GaAsSb) and channel material 115B is also a crystal including a Group III-V alloy (e.g., GaAs, InP, InAs, InGaAs, AlGaAs, GaP, AlAs, InGaP, InSb, GaAsSb) are also possible.

In the example illustrated in FIG. 1B, device layer 107 is between isolation dielectric 110 and source and drain 111. Where both device layer 107 and source and drain 111 are the same material (e.g., both Ge), an interface between device layer 107 and source and drain 111 may not be evident (e.g., in a TEM). Device layer 107 may also extend between isolation dielectric 110 and embedded spacer 120, as shown.

Gate dielectric 140 may have any composition and any thickness known to be suitable for transistors having a predetermined semiconductor composition and that are operable under predetermined bias conditions. In some embodiments, gate dielectric 140 is a material having a moderate relative permittivity (e.g., k value below 9), such as, but not limited to silicon dioxide, silicon oxynitride, or silicon nitride. In some other embodiments, gate dielectric 140 is a material having a high relative permittivity (e.g., k value above 10). The high-k dielectric material may include elements such as hafnium, silicon, oxygen, titanium, tantalum, lanthanum, aluminum, zirconium, barium, strontium, yttrium, lead, scandium, niobium, and zinc. The high-k material in some embodiments is a metal oxide (e.g., comprising one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate). The high-k material in some embodiments is a metal silicate (e.g., comprising one or more of above metals, oxygen and silicon). In still other embodiments, gate dielectric 140 includes two or more dielectric material layers, such as, but not limited to, a layer with a higher relative permittivity over a layer with a lower relative permittivity. The one or more layers may include silicon oxide, silicon dioxide ($SiO_2$) and/or a high-k dielectric material.

Gate electrode 150 may have any composition to be suitable for controlling the channel conductivity of a semiconductor channel Gate electrode 150 may have any suitable work function and may include a doped semiconductor (e.g., polysilicon), or an elemental metal layer, a metal alloy layer, and/or laminate structure. The gate electrode 150 may include a mid-gap work function metal suitable for both of the complementary conductivity types of the semiconductor materials chosen for channel materials 115A and 115B. In some implementations, gate electrode 150 includes a stack of two or more metal layers, where one or more metal layers are work function metal layers and at least one metal layer is a conductive fill layer. Examples of work function metals include ruthenium, palladium, platinum, cobalt, nickel, and conductive metal oxides (e.g., ruthenium oxide), hafnium, zirconium, titanium, tantalum, aluminum, alloys of these metals, and carbides of these metals such as hafnium carbide, zirconium carbide, titanium carbide, tantalum carbide, and aluminum carbide.

A number of methods may be employed to fabricate CMOS structure 101. FIG. 2 is a flow diagram illustrating methods 201 for fabricating a CMOS structure with stacked N-type and P-Type transistors employing a non-silicon channel semiconductor. Methods 301 may be employed, for example, to fabricate CMOS structure 101, for example. Referring to FIG. 2, methods 201 begin at operation 210 where a multi-layered non-silicon fin is formed over a workpiece. In some embodiments, the workpiece includes a semiconductor wafer, such as a large format (e.g., 300-450 mm) silicon wafer. The workpiece may include one or more underlying device layers, for example, and need not be a virgin starting wafer as embodiments herein are not limited in this context.

In some embodiments, a multi-layered fin structure is formed over a Ge-on-insulator (GOI) substrate. The GOI substrate may have been generated upstream of methods 201 according to any technique, such as, but not limited to, wafer-level bonding and layer-transfer. At operation 210 a non-selective blanket (e.g., wafer-level) film stack growth is performed over the GOI (or other SOD substrate. The semiconductor layers grown at operation 210 may advantageously include at least one non-silicon material layer suitable for N-type transistor fabrication and at least on non-silicon material layer suitable for P-type transistor fabrication. Any suitable epitaxial growth techniques, such as, but not limited to, molecular beam epitaxy (MBE) or metalorganic chemical vapor deposition (MOCVD), may be practiced at operation 210. In some embodiments where a Ge-on-insulator (GOI) substrate is received, both Ge and III-V alloy material layers may be gown on the GOI device layer as a blanket epitaxial film stack. In addition to growing channel materials over the GOI substrate, the epitaxial growth may form one or more intervening epitaxial layer between the channel materials. For example, a III-V alloy (e.g., GaAs) may be grown between a Ge channel material and the GOI substrate. A III-V alloy (e.g., GaAs) may also be grown between a Ge channel material and an InGaAs channel material, for example.

In some alternative embodiments, a selective epitaxial growth technique is practiced at operation 210. For example, aspect ratio trapping (ART) may be employed at operation 310 to achieve acceptable crystal quality in a heteroepitaxial fin stack. In some exemplary ART embodiments, a trench is formed in an amorphous growth mask material (e.g., a dielectric) at operation 210. For such embodiments, the workpiece received at operation 210 may, for example, include a silicon layer under a dielectric growth mask layer. The trench formed at operation 210 may expose the silicon and a non-silicon seed layer is grown over the silicon. In some embodiments, the non-silicon seed layer grown within the trench at operation 210 comprises Ge (e.g., intrinsic Ge). In some alternative embodiments, the first crystal layer grown within the trench at operation 210 comprises a III-V alloy. Germanium, while having a different lattice constant than silicon, may be more readily grown from a silicon seeding surface than some III-V alloys. However, GaAs is an example of a III-V alloy that can be grown from a silicon seeding surface with reasonable crystal quality when the ART technique is practiced. Selective film stack growth may continue at operation 210 with the growth of at least one non-silicon channel material suitable for P-type transistors and at least one non-silicon channel material suitable for N-type transistors. The epitaxial growth may also form one or more intervening epitaxial layer between the channel materials. For example, a III-V alloy (e.g., GaAs) may be grown between a Ge layer and an InGaAs layer.

Methods 201 continue at operation 220 where a gate structure is formed over channel region of the multi-layered fin. Any "gate first" or "gate last" process suitable for a finFET may be employed at operation 220 to form a gate stack that is over both channel materials of the semiconductor material stack. The gate stack formed at operation 220 may define the channels of both the P-type and N-type transistors concurrently (e.g., self-aligning the channels to the gate stack).

At operation 230, both an N-type source and drain and a P-type source and drain are formed. In some embodiments, the P-type source and drain are formed first, for example through any suitable impurity implantation process and/or through any suitable epitaxial growth process. The N-type source and drain may then be formed subsequently, for example through any suitable impurity implantation process and/or through any suitable epitaxial growth process. Where the techniques for forming the P-type and N-type source and drain differ, lateral dimensions of the P-type and N-type source and drain may differ significantly, as described further below.

At operation 240, source and drain terminal contacts are formed to each of the source and drains. The terminal contacts may be formed with any patterning and deposition techniques known to be suitable for the formation of contacts and/or conductive vias to finFET structures. In some embodiments, operation 240 includes deposition of one or more dielectric materials over the source and drain material formed at operation 230. One or more openings may be patterned into the dielectric materials to expose one or more of the source and drains. One or more metals may be deposited into the openings to contact the one or more of the source or drains. Methods 201 then end at operation 260 with completion of the transistor structures according to any techniques known to be suitable for finFET devices.

Figure 3:
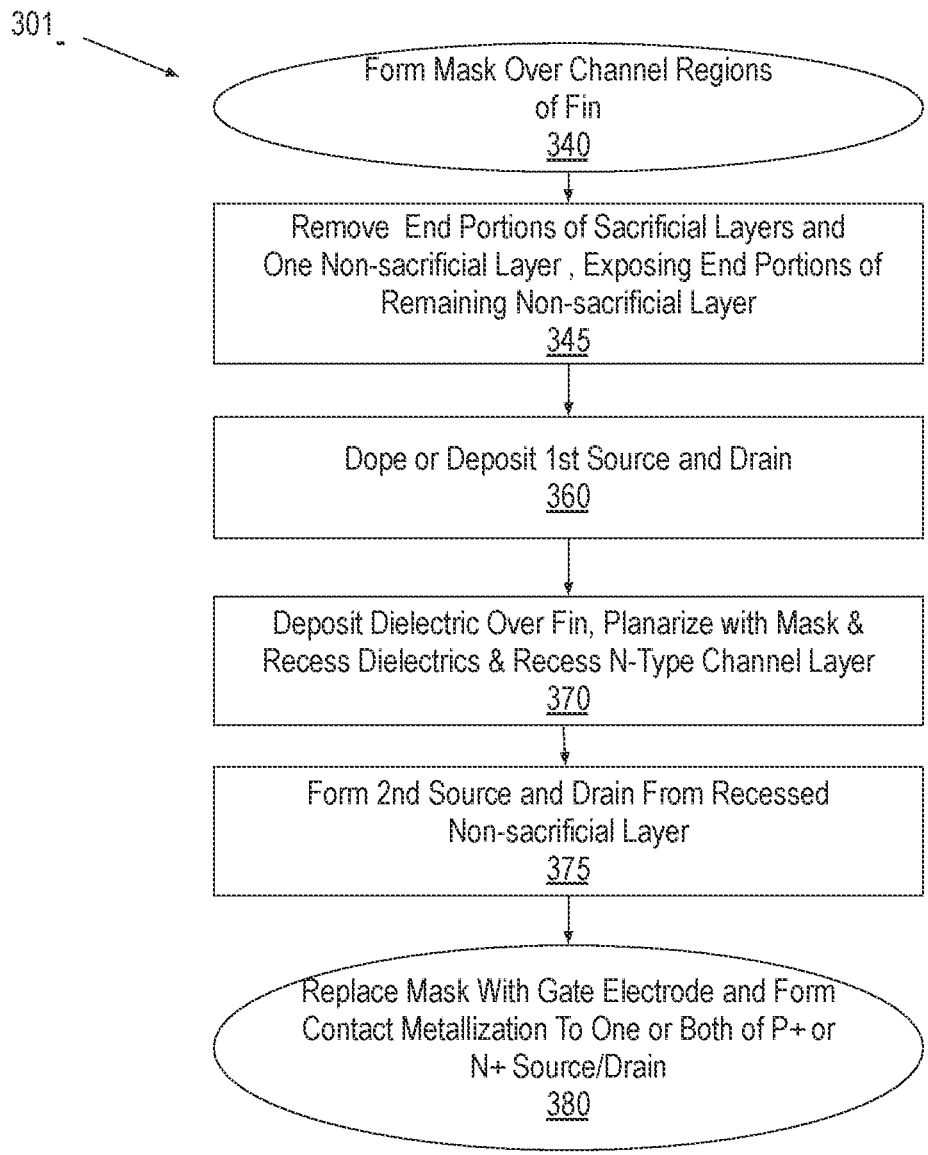
FIG. 3 illustrates a flow diagram illustrating methods for fabricating stacked non-silicon N-Type and P-Type nanowire transistor structures, in accordance with some embodiments.
Figure 4:
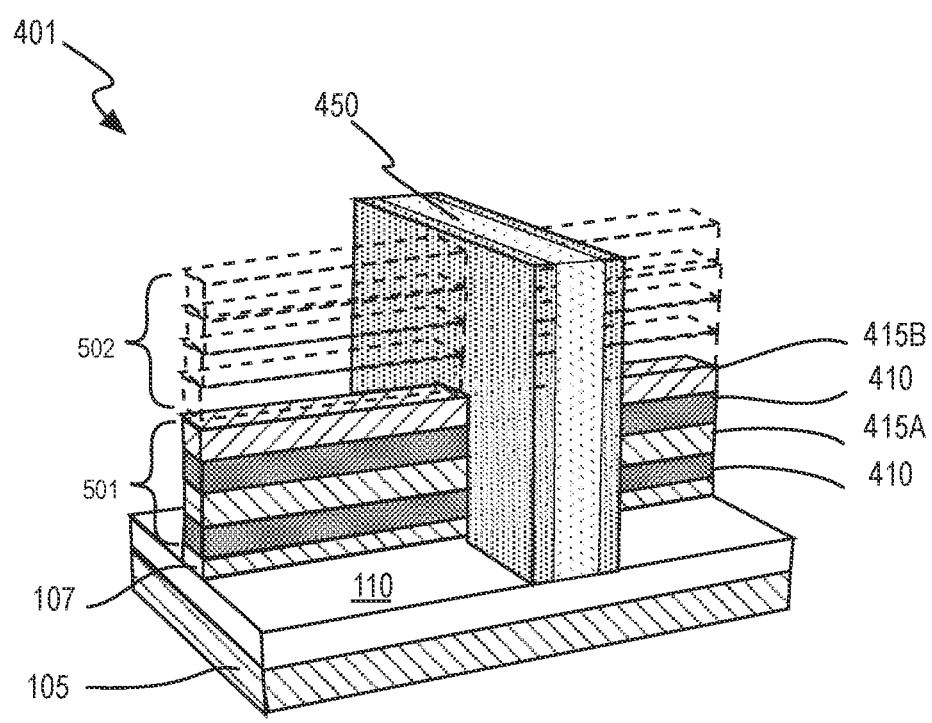
FIGS. 4, 5, 6, 7A, 7B, 7C, 8, 9, 10 and 11 illustrate isometric sectional views of stacked non-silicon nanowire transistor structures evolving as various operations in the methods illustrated in FIG. 2 or 3 are performed, in accordance with some embodiments.

FIG. 3 is a flow diagram illustrating methods 301 for fabricating stacked non-silicon N-type and P-type nanowire transistor structures, in accordance with some embodiments. Methods 301 are one example of a "gate-last" fabrication process that may be practiced as part of methods 201, for example to fabricated CMOS structure 101 (FIG. 1A). FIGS. 4, 5, 6, 7A, 7B, 7C, 8, 9, 10 and 11 are isometric views of stacked non-silicon nanowire transistor structures evolving as various operations in the methods illustrated in FIGS. 2 and/or 3 are performed, in accordance with some embodiments.

Referring first to FIG. 3, methods 301 begin with forming a mask over channel regions of a multi-layered fin. In the intermediate structure 401 illustrated in FIG. 4, a sacrificial gate material 450 and a dielectric spacer material 130 has been formed over a channel region of a multi-layered fin 501 that includes a first semiconductor material layer 415A under a second semiconductor material layer 415B. Below each of semiconductor material layers 415A and 415B is a sacrificial semiconductor material layer 410. At a base of multi-layered fin 501 is device layer 107, which has also been patterned into a base or sub-fin portion of multi-layered fin 501. Notably, semiconductor material layers 415A and 415B are illustrated as an exemplary single pair of stacked layers (separated by intervening sacrificial material layer 410). However, any number of layers (e.g., 3 or 4 PMOS/NMOS semiconductor material layer pairs) may be defined in a multi-layered fin. One or more of material layers 415A and 415B may be replicated, for example to increase the current carrying capability of one or more of a PMOS or NMOS transistor within a footprint of CMOS structure. For example, multi-layered fin 501 may include additional layers 502 shown in dashed line. For some such embodiments, additional layers 502 may include one or more replications of material layers 415A and 415B, again separated by intervening sacrificial material 410. In some advantageous embodiments, multiple semiconductor material layers 415A are positioned below multiple semiconductor material layers 415B to increase the current carrying capability of both PMOS and NMOS transistors. Hence, the semiconductor material layers drawn in solid line in FIG. 4 may all be of a first conductivity type (e.g., suitable for PMOS transistors) while the semiconductor material layers drawn in dashed line in FIG. 4 may all be of a second conductivity type (e.g., suitable for NMOS transistors).

Semiconductor material layers 415A and 415B may be any of the materials described above for channel materials 115A and/or 115B (FIG. 1B) as the portion of semiconductor material layers 415A and 415B that are covered by sacrificial gate material 450 and/or by dielectric spacer material 130 are to become channel materials 115A and 115B, respectively. Semiconductor material layers 410 may include any semiconductor material that maintains crystallinity of multi-layered fin 501 and has a composition sufficiently different than material layers 415A and 415B that one or more etch processes (e.g., wet chemical etch) can remove them selectively from between material layers 415A and 415B. In some embodiments, both semiconductor material layers 410 are substantially the same III-V alloy. In some exemplary embodiments semiconductor material layers 410 are GaAs. For embodiments where device layer 107 and/or semiconductor material layer 415A is Ge, GaAs is advantageous at least in terms of lattice match.

Returning to FIG. 3, methods 301 continue with operation 345 where end portions of at least some layers of the multi-layered fin are removed while the mask protects the channel portion. In some exemplary embodiments, end portions of an uppermost one of the non-sacrificial semiconductor layers are removed to expose end portions of another of the non-sacrificial semiconductor layers. Once exposed, a first source and drain is formed at operation 360, for example by doping the end portions of the non-sacrificial semiconductor layer, and/or regrowing impurity-doped semiconductor material. Following formation of the first source and drain, a dielectric material may be deposited and planarized with a top surface of the channel mask at operation 370. This dielectric material may then be recessed in preparation for formation of the second source and drain.

Figure 5:
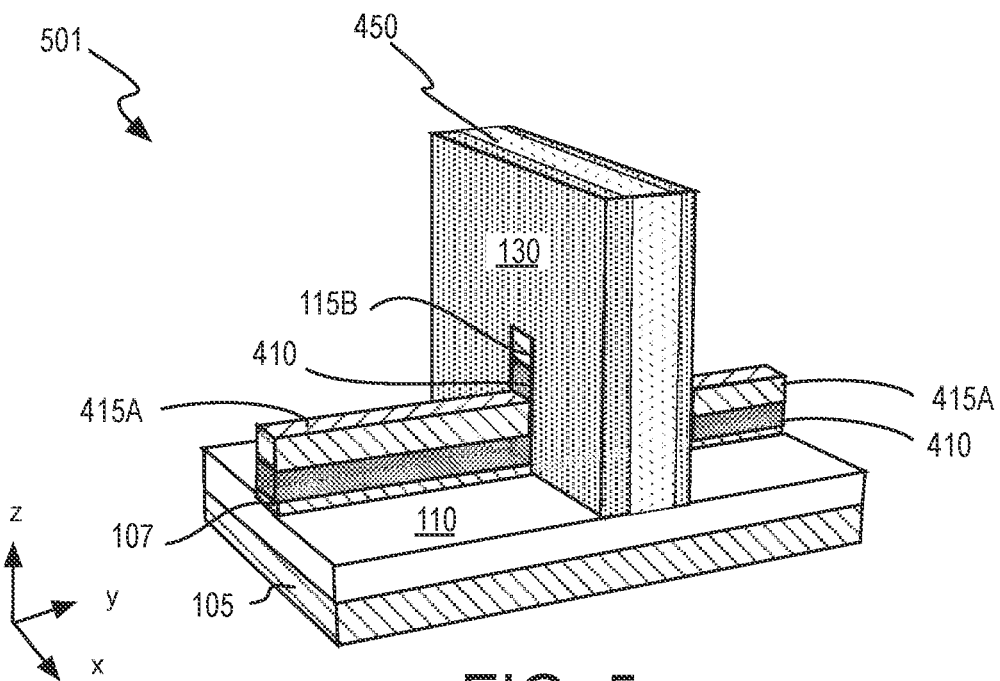
Figure 6:
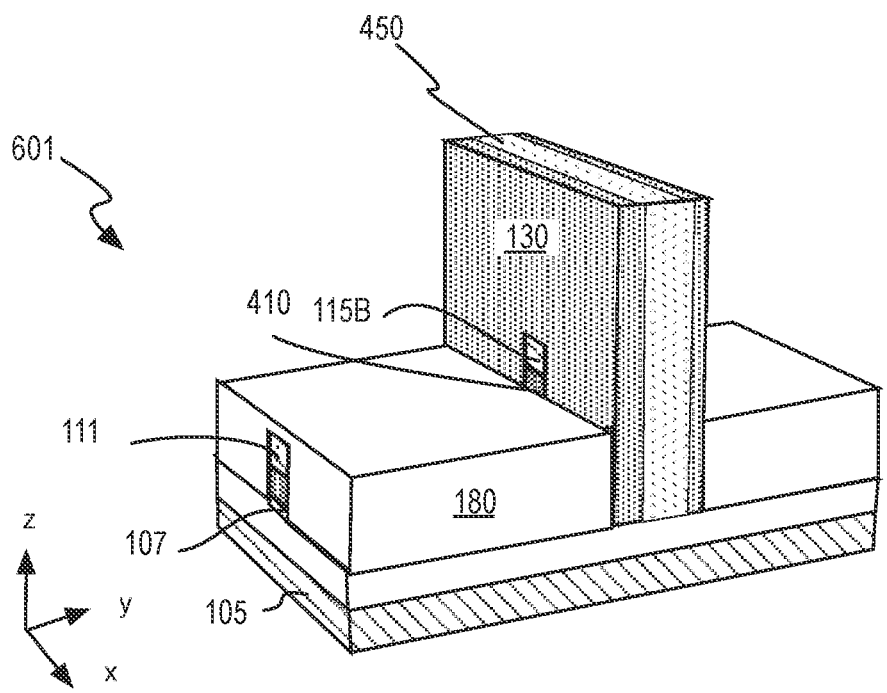

In one exemplary intermediate structure 501 further shown in FIG. 5, end portions of semiconductor material layer 415B have removed, for example with a selective etch process, leaving channel material 115B protected by dielectric spacer 130 and sacrificial gate 450. Semiconductor material layer 410 has been similarly removed, for example with a selective etch process, exposing semiconductor material layer 415A. In some embodiments, semiconductor material layer 415A is then impurity doped, for example by implanting dopants into the exposed ends of semiconductor material layer 415A, to form source and drain 111. Impurities may alternatively be introduced according to any other known doping technique (e.g., solid state diffusion, etc.). In the intermediate structure 601 illustrated in FIG. 6, dielectric material 180 has been deposited over intermediate structure 501 following the formation of source and drain 111. Dielectric material 180 has been planarized with a top surface of sacrificial gate material 450 and then selectively recessed with a suitable etch process to a level that exposes ends of channel material 115B while still covering source and drain 111.

Figure 7A:
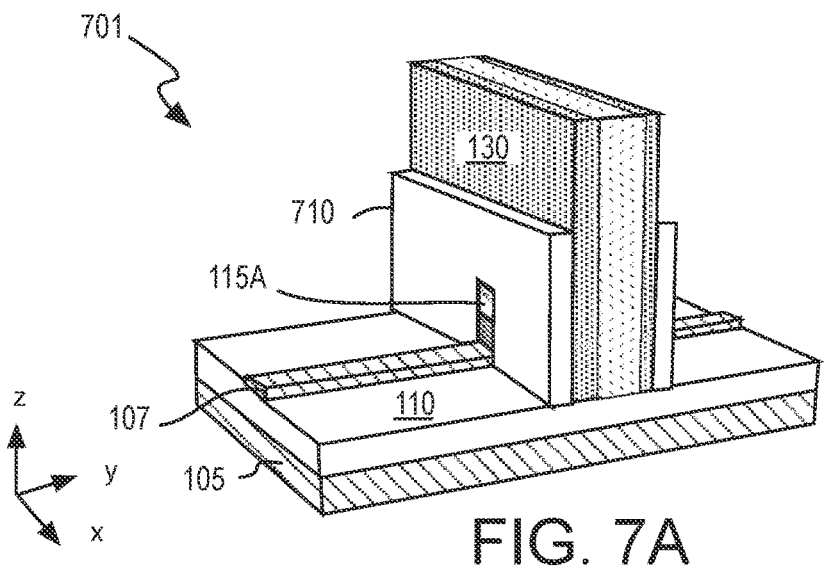
Figure 7B:
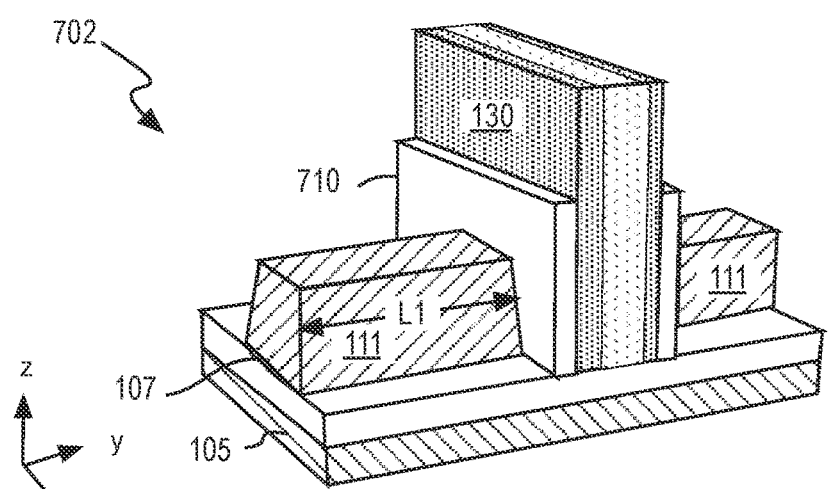
Figure 7C:
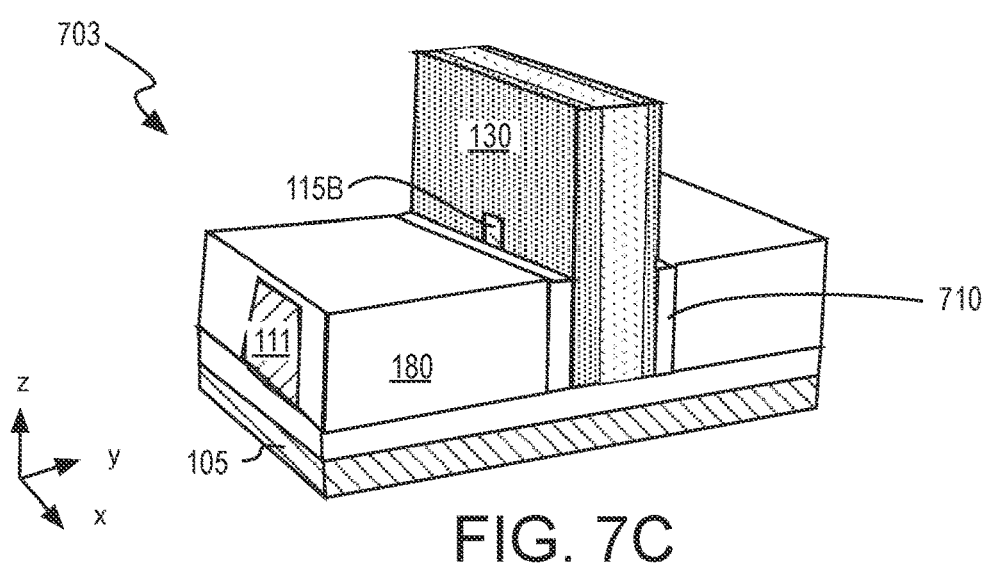

FIGS. 7A, 7B and 7C illustrate alternative methods, respectively, where a second dielectric spacer 710 is formed adjacent to dielectric spacer 130, for example following the exposure of semiconductor material layer 415A (e.g., as shown for structure 501 in FIG. 5). Dielectric spacer 710 may be formed, for example, with a conformal deposition of a dielectric material having a different composition that of dielectric spacer 130 followed by an anisotropic etch. After forming second dielectric spacer 710, semiconductor material layer 415A is removed, for example with a selective etch process, leaving at least a residual channel material 115A. In the intermediate structure 701 illustrated in FIG. 7A, end portions of all sacrificial semiconductor layers have also been removed, for example with selective etch processes, leaving only device layer 107. An epitaxial growth and/or selective deposition process (e.g., MBE, CVD, or MOCVD) may then be employed to form source and drain 111. The epitaxial growth or deposition process may, for example, selectively form Ge or a III-V alloy directly upon device layer 107, for example. The epitaxial growth or deposition process may also, or in the alternative, selectively form Ge or a III-V alloy directly upon an exposed end of channel material 115, for example. The lateral dimensions of source and drain 111 may be indicative of whether device layer 107 was employed as a seeding surface in addition to the exposed end of channel material 115. For example, source and drain 111 shown for the intermediate structure 702 in FIG. 7B has a greater lateral length L1 than vertical height, which may be indicative of device layer 107 having served as a seed layer for the formation of source and drain 111.

In the intermediate structure 703 illustrated in FIG. 7C, dielectric material 180 has been deposited over intermediate structure 702. Once planarized with a top surface of sacrificial gate material 450, dielectric material 180 is selectively recessed to a level that exposes ends of channel material 115B while still covering source and drain 111.

Figure 8:
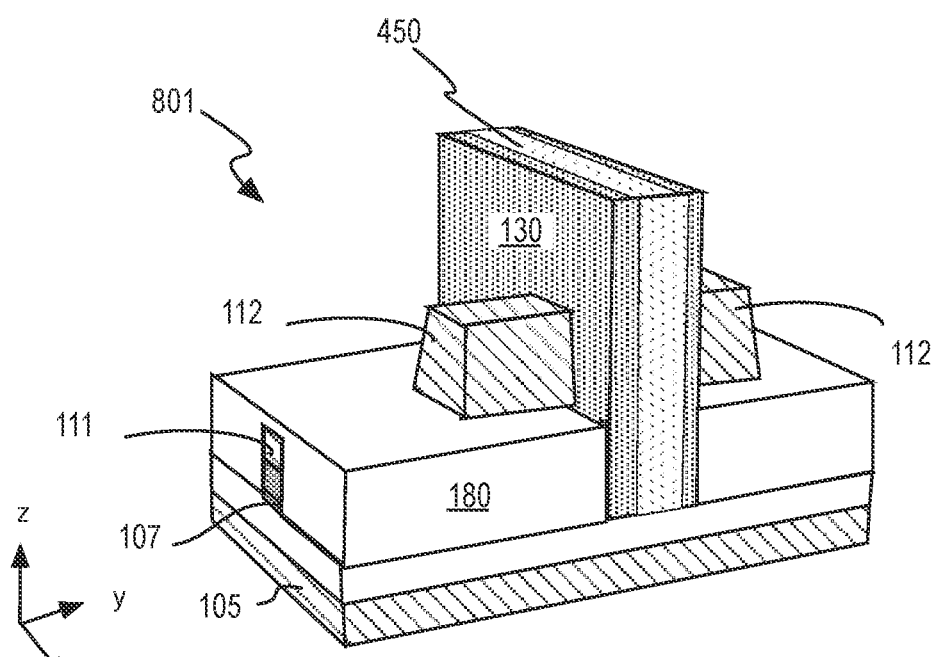
Figure 9:
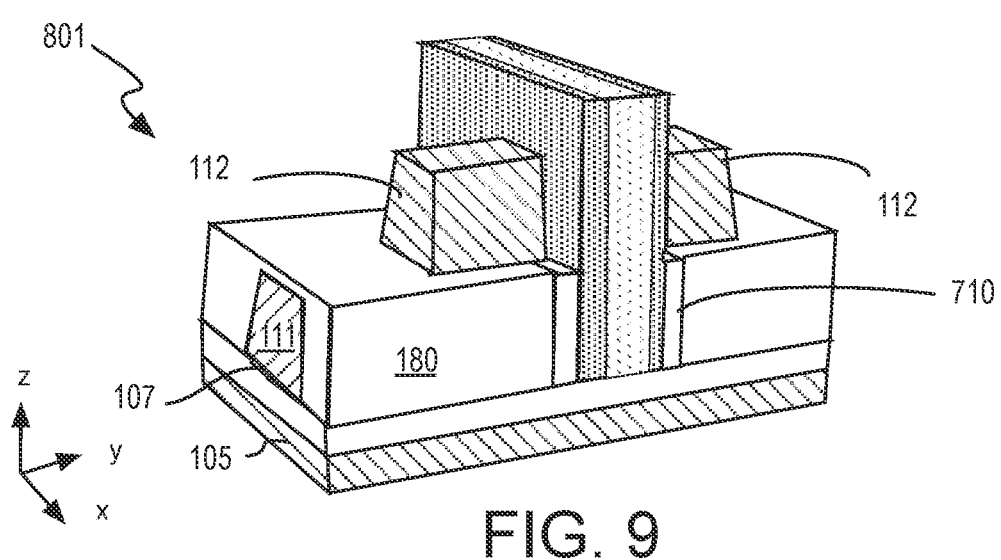
Figure 10:
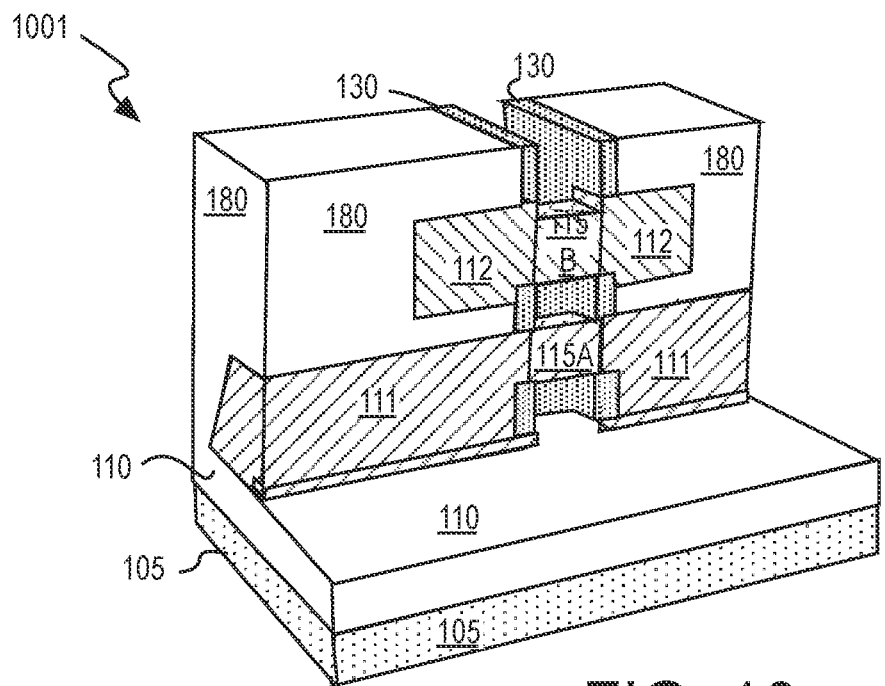

With the first source and drain protected with dielectric material 180, methods 301 (FIG. 3) continue at operation 375 where a second source and drain is formed from ends of the channel material protected by the channel mask. Any selective deposition or epitaxial process suitable for the source and drain material may be performed at operation 375. An exemplary intermediate structure 801 is illustrated in FIG. 8. Intermediate structure 801 includes intermediate structure 601 (FIG. 6) following epitaxial growth of source and drain 112 from ends of channel material 115B. Another exemplary intermediate structure 901 is illustrated in FIG. 9. Intermediate structure 901 includes intermediate structure 703 (FIG. 7C) following epitaxial growth of source and drain 112 from ends of channel material 115B.

Returning to FIG. 3, methods 301 complete at operation 380 where the sacrificial gate material is replaced with any suitable gate stack. Any gate replacement process suitable for nanowire and/or finFET devices may be practiced at operation 380. In the example further illustrated in FIG. 10, intermediate structure 1001 includes intermediate structure 801. As illustrated in the sectional view, sacrificial gate material 450 has been removed, which exposes sacrificial semiconductor material layers 410 as well as channel materials 115A and 115B. Sacrificial semiconductor material layers 410 may then be selectively etched. Optionally, any portions of device layer 107 exposed upon removal of sacrificial gate material 450 may also be stripped off before gate stack materials are backfilled over the length of the exposed channel regions.

To form the gate stack, a gate dielectric material may be deposited on sidewalls of the embedded spacer as well as fully surround channel materials 115A and 115B. A gate electrode material may be deposited over the gate dielectric material, ideally backfilling any voids between the semiconductor channel materials and/or between the semiconductor channel material and isolation dielectric 110. Any known deposition processes may be employed in the formation of the final gate stack, such as ALD, for example. Prior to gate stack formation, additional dielectric material 180 may be deposited over the source/drain and planarized with the channel mask.

Figure 11:
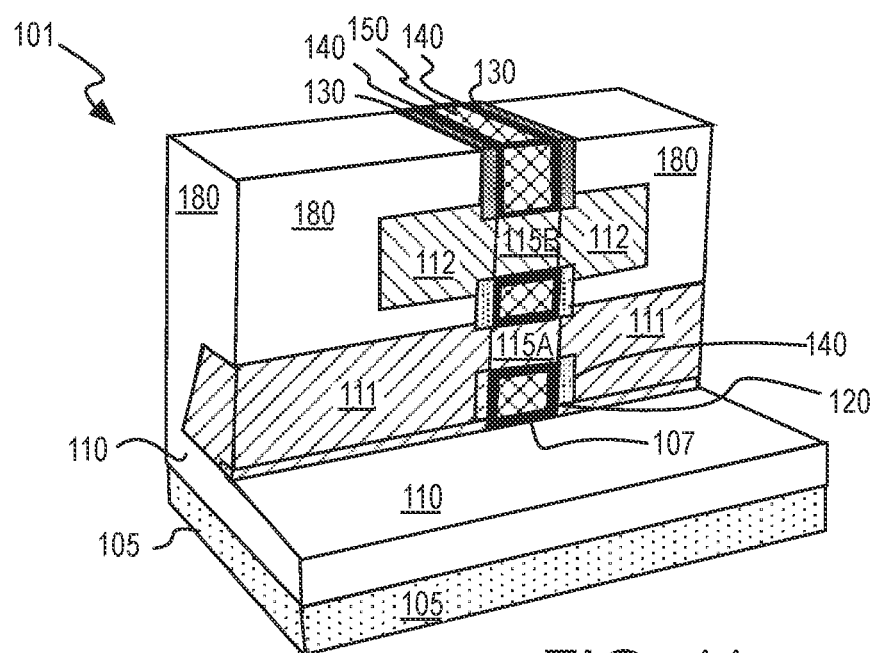

FIG. 11 further illustrates CMOS device structure 101 following the deposition of a gate stack that includes gate dielectric 140 and gate electrode 150, arriving at the structure introduced in FIGS. 1A and 1B. Following formation of the 1 gate stack, CMOS device structure 101 may be completed with formation of source and drain terminal contacts according to any suitable techniques. CMOS device structure 101 may then be electrically interconnected with other transistors and/or CMOS device structures into integrated circuitry through any known back-end-of-line (BEOL) metallization processes.

Figure 12:
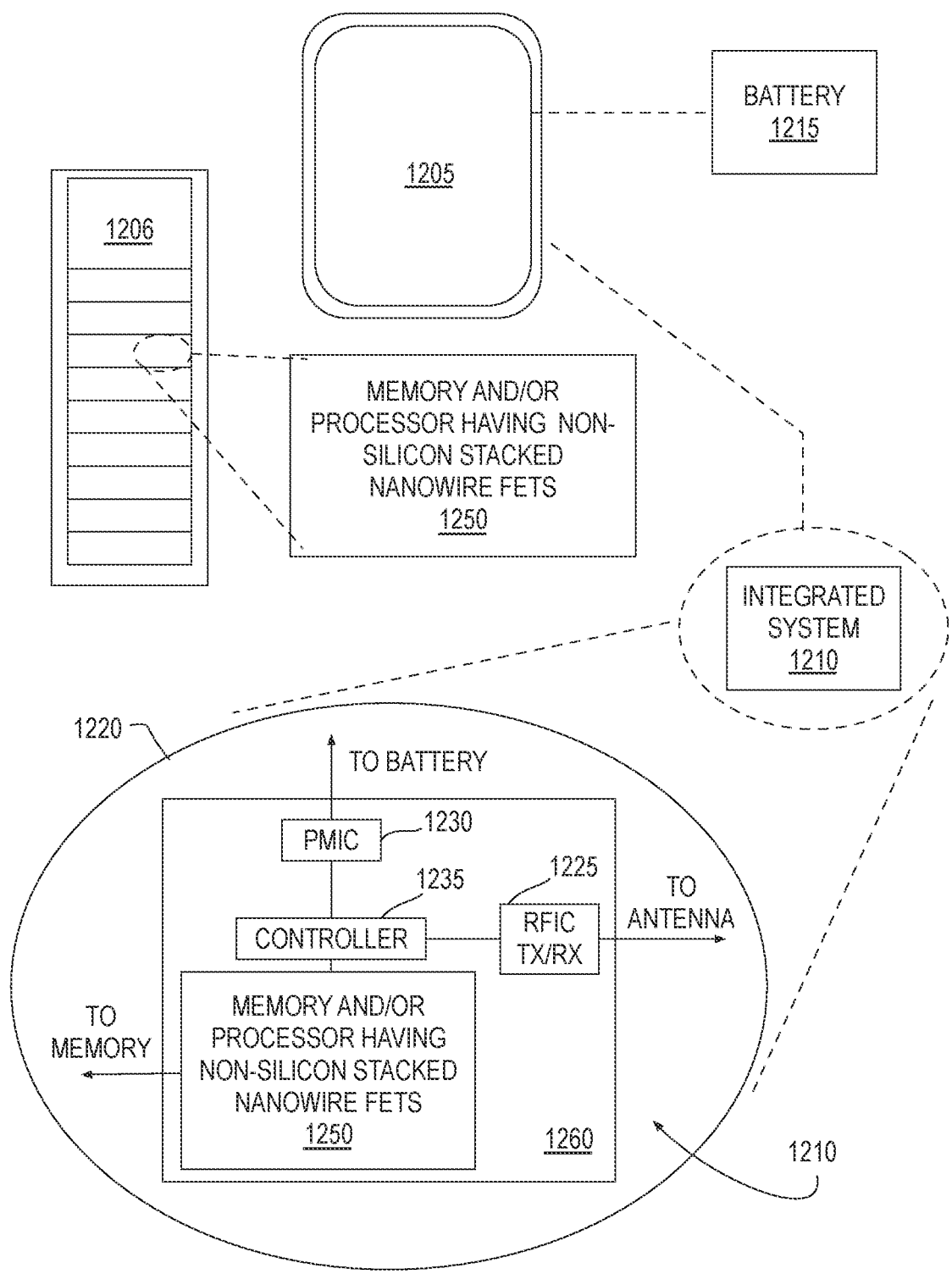
FIG. 12 illustrates a mobile computing platform and a data server machine including a processor with stacked non-silicon transistor structures, in accordance with some exemplary embodiments.

FIG. 12 illustrates a mobile computing platform and a data server machine employing a processor 1250 including stacked device circuitry having vertically stacked N-Type and P-Type transistors with non-silicon channel semiconductor, for example as described elsewhere herein. The server machine 1206 may be any commercial server, for example including any number of high-performance computing platforms disposed within a rack and networked together for electronic data processing. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215.

Disposed within the integrated system 1210, a substrate 1260 includes stacked processor circuitry 1240 (e.g., a microprocessor, a multi-core microprocessor, graphics processor, or the like). The stacked circuitry may include vertically stacked N-Type and P-Type transistors with non-silicon channel semiconductor, for example as described elsewhere herein. For monolithic embodiments, substrate 1260 is a semiconductor chip. For other embodiments, substrate 1260 may be any package substrate, or an interposer. Processor circuitry 1240, or a separate RFIC chip may be further coupled to an antenna (not shown) to implement any of a number of wireless standards or protocols, including but not limited to Wi-Fi (IEEE 1302.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 13:
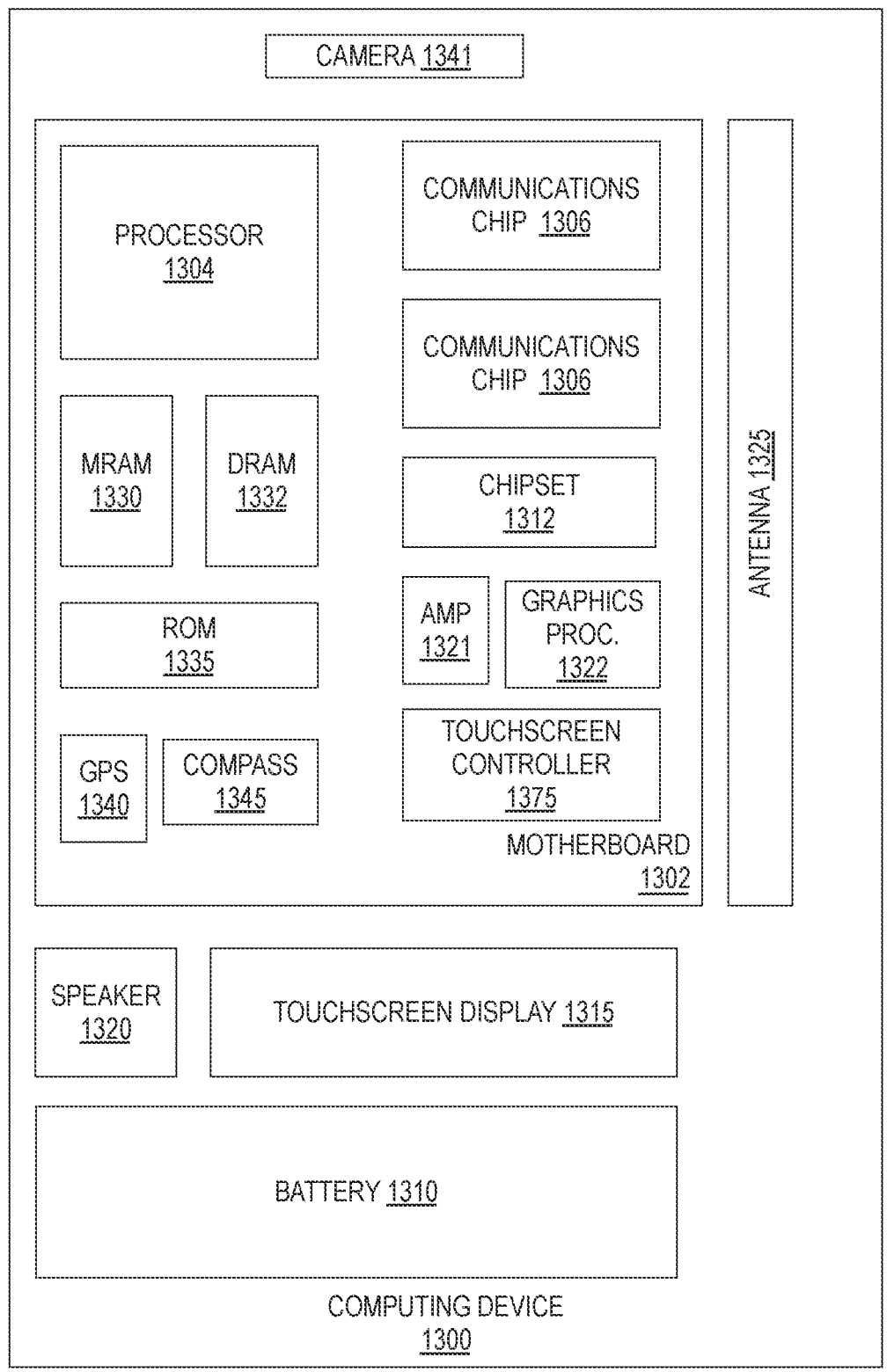
FIG. 13 illustrates a functional block diagram of an electronic computing device, in accordance with some exemplary embodiments.

FIG. 13 is a functional block diagram of an electronic computing device 1300, in accordance with some embodiments. Computing device 1300 may be found inside platform 1205 or server machine 1206, for example. Device 1300 further includes a motherboard 1302 hosting a number of components, such as, but not limited to, a processor 1304 (e.g., an applications processor), which may further incorporate sidewall terminal contacts, for example in accordance with embodiments described herein. Processor 1304 may be physically and/or electrically coupled to motherboard 1302. In some examples, processor 1304 includes an integrated circuit die packaged within the processor 1304. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., MRAM 1330, DRAM 1332), non-volatile memory (e.g., ROM 1335), flash memory, a graphics processor 1322, a digital signal processor, a crypto processor, a chipset, an antenna 1325, touchscreen display 1315, touchscreen controller 1375, battery 1310, audio codec, video codec, power amplifier 1321, global positioning system (GPS) device 1340, compass 1345, accelerometer, gyroscope, audio speaker 1320, camera 1341, and mass storage device (such as hard disk drive, solid-state drive (SSD), compact disk (CD), digital versatile disk (DVD), and so forth), or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   a material stack including a first channel material and a second channel material, wherein the first channel material comprises Ge and the second channel material comprises one or more Group III elements and one or more Group V elements;
   one or more gate electrodes adjacent to a sidewall of the first and second channel materials; and
   source and drain terminals coupled to the first and second channel materials.

2. The IC structure of claim 1, wherein the source and drain terminals comprise:
   a first source and a first drain coupled to the first channel material, wherein the first source and the first drain comprise acceptor impurities; and
   a second source and a second drain coupled to the second channel material, wherein the second source and the second drain comprise donor impurities.

3. The IC structure of claim 1, wherein a portion of the gate electrodes is between the first and second channel materials.

4. The IC structure of claim 1, wherein the material stack is over a crystalline substrate material; and
   a portion of the gate electrode is between the material stack and the crystalline substrate material.

5. The IC structure of claim 4, wherein the crystalline substrate material is within a trench that extends through a dielectric material.

6. The IC structure of claim 4, wherein the crystalline substrate material comprises Ge or one or more Group III elements and one or more Group V elements.

7. The IC structure of claim 1, wherein the second channel material comprises Ga.

8. The IC structure of claim 7, wherein the second channel material comprises In, Ga and As.

9. The IC structure of claim 8, wherein In content is between 0.2 and 0.4.

10. The IC structure of claim 1, wherein the second channel material is over the first channel material.

11. An integrated circuit (IC) device, comprising:
    processor circuitry; and
    memory circuitry coupled to the processor circuitry, wherein the processor circuitry comprises a first transistor stacked with a second transistor, and wherein:
    the first transistor comprises a first channel material comprising Ge;
    the second transistor comprises a second channel material comprising one or more Group III elements and one or more Group V elements; and
    one or more gate electrodes adjacent to a sidewall of the first and second channel materials.

12. The IC device of claim 11, wherein the second channel material comprises Ga, and the second channel material is over the first channel material.

13. The IC device of claim 12, wherein the second channel material comprises In, Ga and As.

14. The IC device of claim 13, wherein In content is between 0.2 and 0.4.

15. The IC device of claim 12, further comprising:
a first source and a first drain coupled to the first channel material, wherein the first source and the first drain comprise acceptor impurities; and
a second source and a second drain coupled to the second channel material, wherein the second source and the second drain comprise donor impurities.

16. The IC device of claim 12, wherein:
a portion of the one or more gate electrodes is between the first and second channel materials;
the first and second channel materials are over a crystalline substrate material; and
a portion of the one or more gate electrodes is between the first and second channel materials and the crystalline substrate material.

17. A method of fabricating an integrated circuit (IC) device structure, the method comprising:
forming a material stack comprising a first material layer comprising Ge, and a material second layer comprising one or more Group III elements and one or more Group V elements;
forming a gate electrode adjacent to the first material layer and the second material layer;
forming a first source and a first drain on opposite sides of the gate electrode and coupled with the first material layer; and
forming a second source and a second drain on opposite sides of the gate electrode and coupled with the second material layer.

18. The method of claim 17, wherein:
forming material stack comprises forming the second material layer over the first material layer; and
forming the second material layer comprises epitaxially growing a layer comprising Ga.

19. The method of claim 18, wherein:
forming the material stack further comprises forming a third material layer between the first and second material layers; and
forming the gate electrode further comprises replacing a portion of the third material layer with a portion of the gate electrode.

20. The method of claim 17, wherein forming the first material layer further comprises epitaxially growing substantially pure Ge.

* * * * *